(12) United States Patent
Passerini et al.

(10) Patent No.: US 9,571,092 B2
(45) Date of Patent: Feb. 14, 2017

(54) CASCADED HIGH VOLTAGE SWITCH ARCHITECTURE

(75) Inventors: Marco Passerini, Lozza (IT); Nicola Maglione, Monza (IT)

(73) Assignee: Longitude Semiconductor S.a.r.l., Luxembourg (LU)

( * ) Notice: Subject to any disclaimer, the term of this patent is extended or adjusted under 35 U.S.C. 154(b) by 132 days.

(21) Appl. No.: 13/365,798

(22) Filed: Feb. 3, 2012

(65) Prior Publication Data

US 2013/0200941 A1    Aug. 8, 2013

(51) Int. Cl.
*H03K 17/10* (2006.01)
*H03K 17/687* (2006.01)

(52) U.S. Cl.
CPC .......... *H03K 17/687* (2013.01); *H03K 17/102* (2013.01)

(58) Field of Classification Search
CPC ............... H03K 17/102; H03K 19/018521; H03K 17/687; G11C 8/08; G11C 8/4085
USPC .................................................. 327/333, 434
See application file for complete search history.

(56) References Cited

U.S. PATENT DOCUMENTS

| | | | |
|---|---|---|---|
| 5,729,155 A * | 3/1998 | Kobatake | 326/68 |
| 6,326,839 B2 * | 12/2001 | Proebsting | 327/589 |
| 7,532,054 B2 * | 5/2009 | Kanno et al. | 327/333 |
| 8,218,377 B2 * | 7/2012 | Tandon et al. | 365/189.11 |
| 8,629,706 B2 * | 1/2014 | Chen et al. | 327/333 |

\* cited by examiner

*Primary Examiner* — Lincoln Donovan
*Assistant Examiner* — Colleen O Toole

(57) ABSTRACT

Devices and circuits for high voltage switch (HVS) configurations. HVS may pass high voltage without suffering voltage drops. HVS may also guarantee safe operations for p-mos transistors. HVS may not sink current in its steady state. Further, HVS may select between two or more different voltage values to be passed onto the output node even after the high voltage has already been fully developed on the high voltage supply line.

25 Claims, 13 Drawing Sheets

CASCADED HIGH VOLTAGE SWITCH ARCHITECTURE

FIELD OF THE DISCLOSURE

A new high voltage switch (HVS) architecture is involved.

BACKGROUND

In many electronic devices and applications, high voltages may be found in high demand. For example, for a flash memory, a high voltage can be used to execute operations such as read, write and erase flash memory cells. This high voltage level can be typically generated inside an integrated circuit by using a high voltage generator and routed to appropriate destination points inside the chip. This routing can be done by using a switch inside the chip, and this switch used for routing the high voltage inside the chip to appropriate destination points is called a high voltage switch (HVS).

A high voltage generally means a voltage level higher than a device's power supply level. As explained above, a high voltage can be useful and sometime necessary for many electronic devices nowadays. Since a high voltage generally has a voltage level higher than that of the device's power supply, usually the high voltage is generated and managed inside the chip. For example, a high voltage generator can be embedded on a chip. This can optimize the high voltage generation as well as simplify the design of the circuit board on which the integrated circuit is to be employed. To this purpose, a charge-pump circuit or a voltage doubler circuit can be used. There can be other circuits used, but all of individual elements are not explained here because one of ordinary skill in the art would understand and know how to implement a state-of-art high voltage generator.

Once a high voltage is generated, it usually needs to be routed to a specific destination point inside the chip, such as a specific block or a specific line, in order to perform a given operation. For example, a high voltage level of around ~18 v may be needed for a flash memory to perform program-operation, and this voltage needs to be delivered to a specific flash memory cell in order to program such cell. This routing of a high voltage inside the chip is typically managed by a high voltage switch inside the circuit. There are several state-of-art analog high voltage switch architectures that have been used or employed in most of state-of-art electronic integrated devices.

FIGS. 1a and 1b show examples of two different types of state-of-art high voltage switch configurations. FIG. 2 shows an example of a state-of-art level shifter circuit schematic, which may be employed in the examples shown in FIGS. 1a and 1b.

FIG. 1a shows an example of a p-mos switch. This switch can be used to connect the high voltage line, SUPPLY_HV to the high voltage output line, OUT_HV. Alternatively, this switch can leave the high voltage output line, OUT_HV, floating so as to allow another switch to pass a different voltage level to high voltage output line OUT_HV. Block LEVEL SHIFTER represents a level shifter circuit. This level shifter can be used to drive the gate of the p-mos switch transistor, MP. The gate of MP is connected to output node of the level shifter, OUT_INT_HV. When the output of the level shifter is 0, p-mos switch transistor MP is turned on. Then, the switch can connect high voltage line SUPPLY_HV to high voltage output line OUT_HV. Alternatively, when the output of the level shifter is high (e.g., at SUPPLY_HV), p-mos switch transistor MP is turned off. Then, the switch does not connect high voltage line SUPPLY_HV to high voltage output line OUT_HV. Instead, high voltage output line OUT_HV is left floating. A bulk of p-mos switch transistors MP may be connected to the highest voltage available in the switch (not shown in the figure for simplicity).

FIG. 1b shows an example of n-mos switch. This switch can also be used to connect the high voltage line, SUPPLY_HV to the high voltage output line, OUT_HV. Alternatively, this switch can leave the high voltage output line, OUT_HV, floating so as to allow another switch to pass a different voltage level to high voltage output line OUT_HV. Block LEVEL SHIFTER represents a level shifter circuit. This level shifter can be used to drive the gate of the n-mos switch transistor, MN. The gate of MN is connected to output node of the level shifter, OUT_INT_HV. When the output of the level shifter is high (e.g., at SUPPLY_HV), n-mos switch transistor MN is turned on. Then, the switch can connect high voltage line SUPPLY_HV to high voltage output line OUT_HV. Alternatively, when the output of the level shifter is 0, n-mos switch transistor MN is turned off. Then, the switch does not connect high voltage line SUPPLY_HV to high voltage output line OUT_HV. Instead, high voltage output line OUT_HV is left floating. A bulk of n-mos switch transistors MN are connected to ground, which is not shown for simplicity.

In the state-of-art n-mos switch configurations, such as the one shown in FIG. 1b, the high voltage level supplied needs to be higher than the desired voltage level to be outputted. That is, when the high voltage supplied from SUPPLY_HV passes the n-mos switch transistor to reach high voltage output line OUT_HV, it suffers a voltage drop. That voltage drop can be attributed to the threshold voltage of the n-mos switch transistor. Therefore, if the desired high voltage output level to be detected at OUT_HV is, for example, V1, the voltage level supplied at SUPPLY_HV needs to be at least V1+Vth, when Vth represents the threshold voltage of the n-mos. However, sometimes such high voltage level is not available inside the chip. For example, it may not be within the voltage range that can be generated by the high voltage generator inside the chip. Therefore, the requirement that the high voltage supply level be greater than the desired high voltage output level has been conceived as one of important disadvantages associated with the state-of-art n-mos high voltage switch configurations.

On the other hand, the state-of-art p-mos switch configurations can have several drawbacks as well. One of the main drawbacks can be attributed to their inherent limitation in technology. That is, some p-mos transistors cannot sustain a certain voltage difference higher than the maximum set by the technology, between their drain/source and bulk terminal.

FIG. 3 shows an example of a cross section of a typical p-mos high voltage transistor. The voltage difference between p+ and high voltage n-well HV_NWELL may be limited in some technologies, so as not to exceed a maximum voltage level permitted/allowed by the technology (e.g., transistor specification), Vmax. If the voltage difference between p+ and HV_NWELL exceeds Vmax, then the transistor may suffer a junction breakdown and may not operate properly. Accordingly, if the supply high voltage level greater than Vmax is passed to the p-mos switch, the switch may break down and not operate properly. This can be an inherent limitation to the maximum voltage level that can be supplied to the switch, therefore to the device.

Accordingly, the p-mos switch may not work well in the case when the device needs a high voltage output level greater than the maximum allowed by the technology associated with the p-mos.

To mitigate the problem associated with the p-mos transistors identified above, some have employed a local boosting circuit using n-mos transistors.

FIG. 4 shows an example of state-of-art switch configuration with a local boosting circuit.

FIG. 5 shows an example of simplified circuit schematic for a local boosting circuit. When enable signal EN_B is 0, the circuit is enabled. When the circuit is enabled, output line OUT_INT_HV is pre-charged to the voltage level substantially equal to "VDD−Vth(MN1)." Then, MN2 switch is turned on, which allows node B to pre-charge to the voltage level substantially equal to "VDD−Vth(MN1)−Vth (MN2)." During the first falling-edge of signal CLK, node B is boosted up through capacitor C2. Ideally, node B may be boosted up to the voltage level substantially equal to "2VDD−Vth(MN1)−Vth(MN2)." Then, diode D1 can become forward biased, and output line OUT_INT_HV can charge up to the ideal voltage level substantially equal to "2VDD−Vth(MN1)−Vth(MN2)−Vth(D1)." During the subsequent rising-edge of signal CLK, output line OUT_INT_HV is boosted up through capacitor C1. Ideally, OUT_INT_HV may be boosted up to the voltage level substantially equal to "3VDD−Vth(MN1)−Vth(MN2)−Vth (D1)." Then, node B can ideally charge up as well to the voltage level substantially equal to "3VDD−Vth (MN1)−2Vth(MN2)−Vth(D1)." Ideally, this loop may repeat until node B reaches the voltage level substantially equal to "SUPPLY_HV." This may allow output line OUT_INT_HV to reach an ideal voltage level that is substantially equal to $V_{SUPPLY\_HV}+2VDD-Vth(D1)$.

If that voltage value substantially equal to "$V_{SUPPLY\_HV}+2VDD-Vth(D1)$," is greater than $V_{SUPPLY\_HV}$ reduced by the threshold voltage with body effect of n-mos switch transistor, then the n-mos switch configuration in FIG. 4 is able to fully pass SUPPLY_HV voltage value to output node OUT_HV.

Diodes D2 and D3 of FIG. 5 are used to clamp the voltage value of node OUT_INT_HV to the level substantially equal to "$V_{SUPPLY\_HV}+2Vth(D2,3)$ to reduce breakdown risks.

Further, the circuit in FIG. 5 may be switched off by setting signal EN_B to logic 1 and simultaneously switching off signal CLK. When the circuit is switch off, node OUT_INT_HV may be discharged to ground through MN1 and INV1.

However, there can still be a drawback with this type of state-of-art switch architecture employing a local booster circuit. That is, these circuits such as the one shown in FIG. 5 may incur a large DC current consumption due to their continuous boosting operations. This DC current consumption problem may be worsened by the intrinsic low efficiencies of the employed boosting schemes.

SUMMARY

The proposed high voltage switch (HVS) may allow the high voltage to pass from the supply line to the output line without suffering a voltage drop.

Further, the proposed HVS may also allow switching of the voltage level outputted on the output line either before or after the high voltage is fully developed on the high voltage line by the high voltage generator.

Further, the proposed HVS may be provided with protection sub-circuits, which may guarantee safe operations for p-mos transistors as well as remove or mitigate technological limitations limiting the maximum voltage difference across p-mos junctions be inferior to the high voltage level that is being managed by the switch.

The proposed HVS configuration may allow selecting between the high voltage input and the medium voltage input to be passed onto the output line.

The proposed HVS may prevent current-sinking problem as it does not sink current in its steady state.

The proposed HVS configuration may comprise a core sub-circuit to pass the high voltage levels, two protection sub-circuits for p-mos transistors and an additional sub-circuit to pass the medium voltage level.

In one embodiment, a device includes a first PMOS transistor coupled between a power source line and a first node and including a control gate coupled to a second node and a back gate coupled to the power source line, a second PMOS transistor coupled between the first node and an output node and including a control gate coupled to the second node and a back gate coupled to the first node, a first NMOS transistor coupled between the power source line and the first node and including a control gate supplied with a first voltage, and a third PMOS transistor coupled to the first node and including a control gate supplied with the first voltage.

In another embodiment, a device includes a first power source line supplied with a first voltage potential, a second power source line supplied with a second voltage potential lower than the first voltage potential, and first to third circuits. The first circuit includes first and second transistors coupled in series between the first power source line and a first output node, each including a control gate coupled to a second output node, and third and fourth transistors coupled in series between the first power source line and the second output node, each including a control gate coupled to the first output node. The a second circuit includes a fifth transistor coupled between the second power source line and the first output node and including a control gate coupled to the second output node. The third circuit includes a sixth transistor and a seventh transistor coupled in series between the first power source line and a node, each of the sixth transistor and the seventh transistor including a control gate supplied with a third voltage potential lower than the first voltage potential and higher than the second voltage potential, a connecting point of the sixth transistor and the seventh transistor being coupled to a connecting point of the first and second transistors. The first to fourth and seventh transistors may be of a first conductivity type and the fifth and sixth transistors may be of a second conductivity type different from the first conductivity type.

In still another embodiment, a device includes a command decoder configured to be responsive to a command to produce an enable signal, a voltage generator configured to respond to a power supply voltage inputted from an outside to produce a first power source voltage higher than the power supply voltage, a second power source voltage lower than the first power source voltage, and a first voltage lower than the first power source voltage and higher than the second power source voltage, a voltage switch configured to receive the enable signal, the first and second power source voltages and the first voltage and output one of the first and second power source voltages based on a state of the enable signal, and a decoding circuit configured to apply the one of the first and second power source voltages to one of signal lines corresponding to an information of an address signal. The voltage switch includes a selection circuit configured to output one of the first and second power source voltages based on the state of the enable signal, and a protection circuit including a first transistor to set a node of the selection circuit to a voltage potential within a predetermined range based on the first voltage.

DETAILED DESCRIPTION

The claimed subject matter will now be described herein with reference to illustrative embodiments. Those skilled in the art will recognize that many alternative embodiments can be accomplished using the teachings of this disclosure and that the claimed subject matter is not limited to the embodiments illustrated here for explanatory purposes.

Described are methods and circuits for high voltage switch architectures that can allow passing of the high voltage value from the supply line to the output line without having to suffer a voltage drop. Further, the proposed HVS may also allow switching of the voltage levels after the high voltage is fully developed on the high voltage line. Further, the proposed HVS may guarantee safe operations for p-mos transistors without being limited by the p-mos technologies.

The proposed HVS configuration may also allow selecting between the high voltage input and the medium voltage input. The proposed HVS may also prevent current-sinking problem as it does not sink current in its steady state.

The above can be achieved, for example, by employing a core sub-circuit to pass the high voltage levels, two protection sub-circuits for p-mos transistors and an additional sub-circuit to pass the medium voltage level. However, various modifications and embodiments are possible as well, as described below and as would be readily apparent to one of ordinary skill in the art in view of the teachings of this application. For example, it may be possible to adopt the below-explained concept and modify the HVS to employ more than two protection sub-circuits, and/or make available more than two voltage inputs, etc.

First Embodiment

Figure 1A:
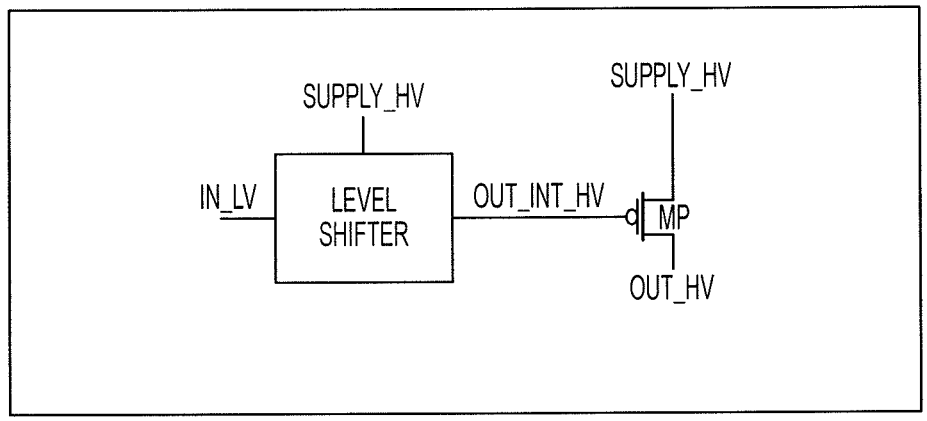
FIG. 1a illustrates an example of state-of-art p-mos high voltage switch configuration.
Figure 1B:
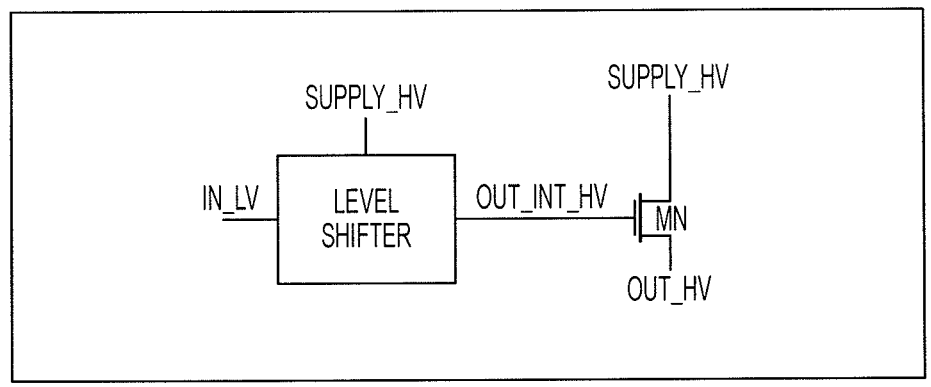
FIG. 1b illustrates an example of state-of-art n-mos high voltage switch configuration.
Figure 2:
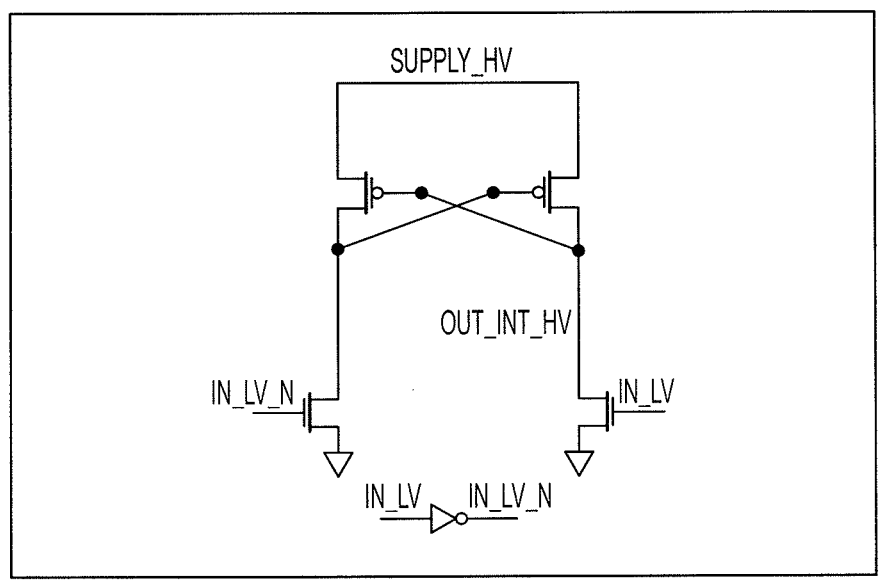
FIG. 2 illustrates an example of state-of-art level shifter configuration.
Figure 3:
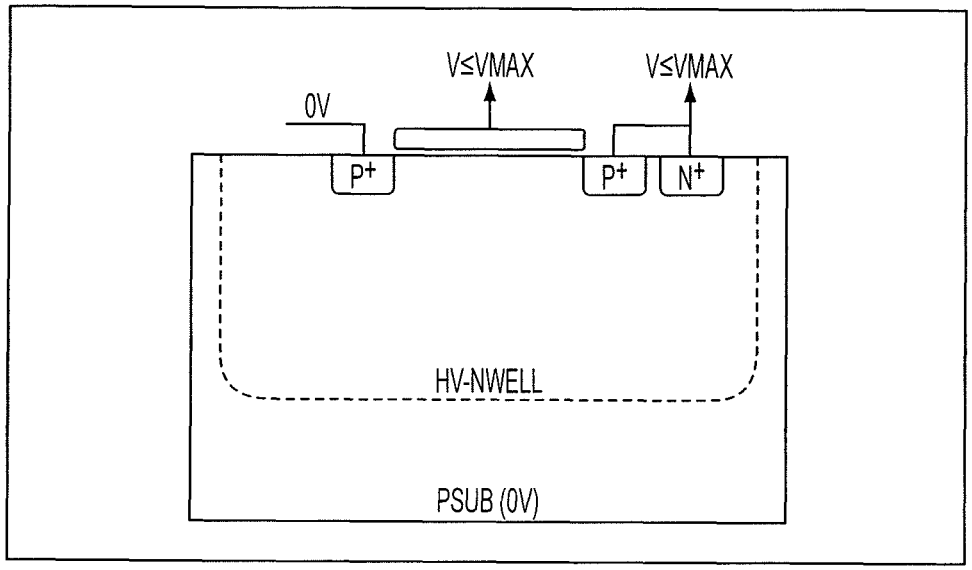
FIG. 3 illustrates an exemplary cross-sectional view of a high voltage p-mos transistor.
Figure 4:
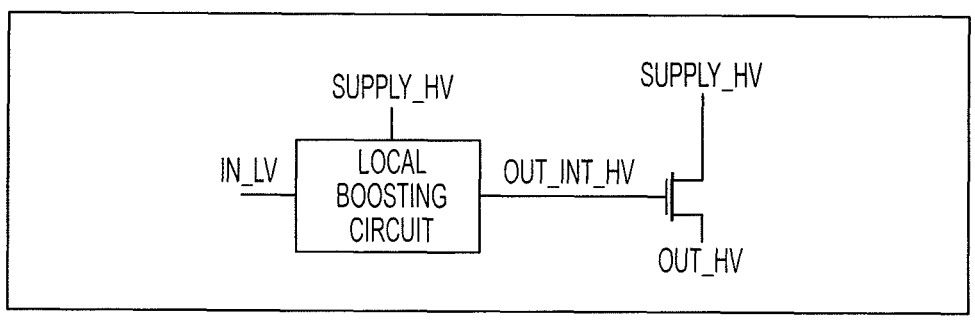
FIG. 4 illustrates an example of state-of-art high voltage switch configuration employing a local boosting circuit.
Figure 5:
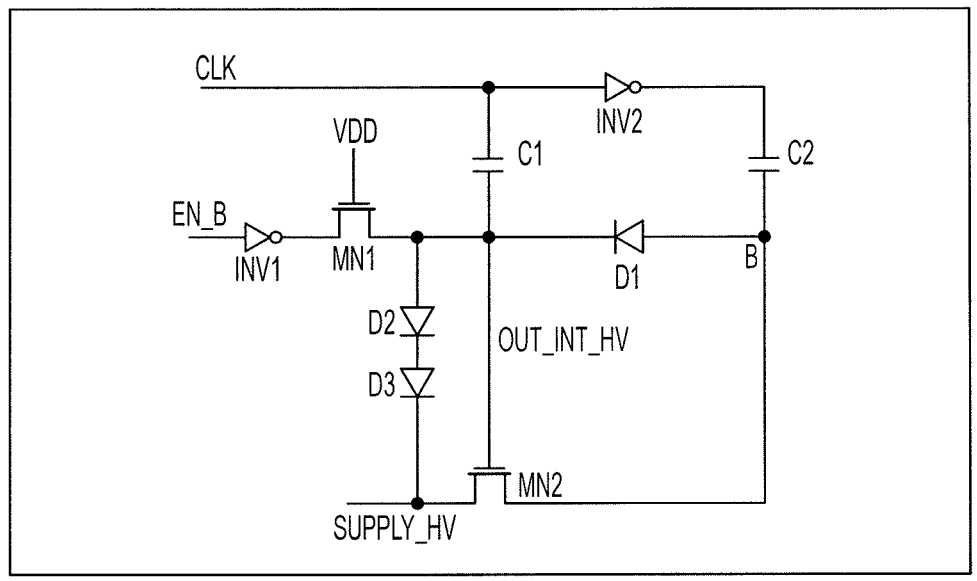
FIG. 5 illustrates an example of state-of-art local boosting circuit.
Figure 6:
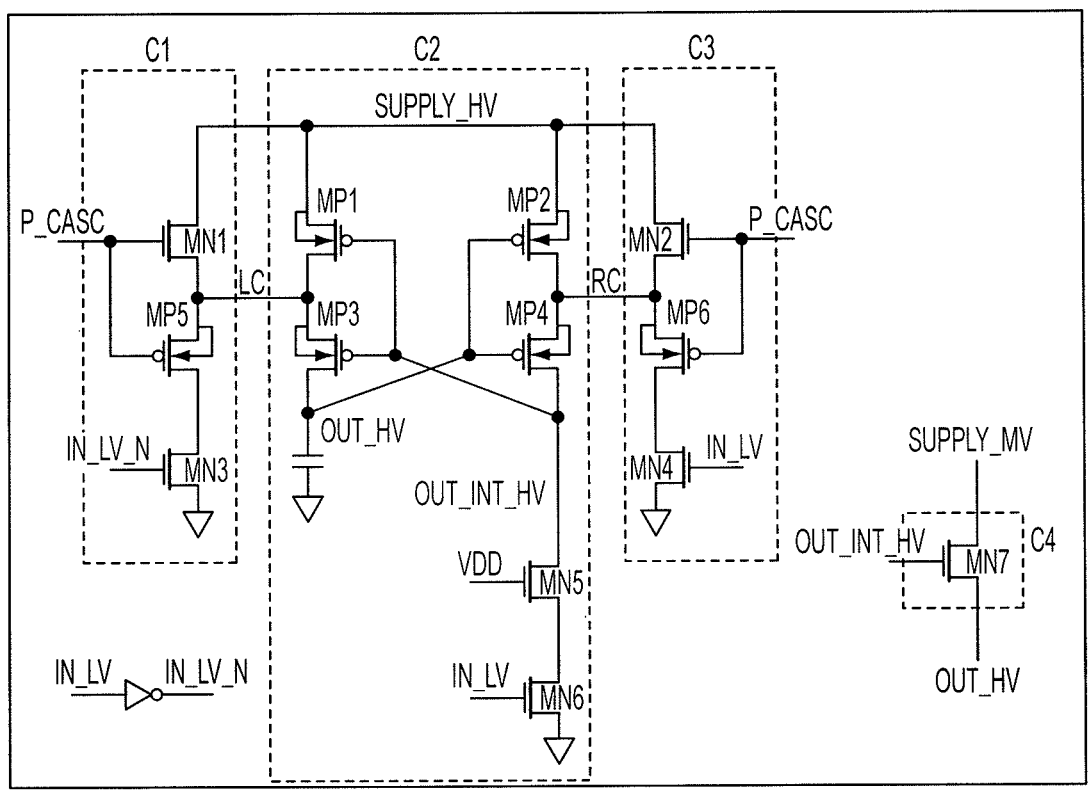
FIG. 6 illustrates an example of proposed embodiment for the high voltage switch configuration (HVS).

FIG. 6 shows an example of a proposed embodiment for a high voltage switch configuration (HVS). In this embodiment, the HVS can pass to output node OUT_HV one of the two following voltage levels: (1) a high voltage level (VH) and (2) a medium voltage level (VM). In this context a medium voltage level (VM) means a voltage level that is lower than the high voltage level (VH).

In this embodiment the circuit may be seen as being comprised of four sub-circuits. FIG. 6 shows an example of each of these four sub-circuits (C1, C2, C3 and C4) being delimited by a dotted rectangular box. Sub-circuits C1 and C3 are protection sub-circuits provided to prevent damage to p-mos transistors (MP1, MP2, MP3 and MP4) in sub-circuit C2. Sub-circuit C2 is provided for passing high voltage level (VH) to output node OUT_HV. Sub-circuit C4, on the other hand, is provided for passing medium voltage level (VM) to output node OUT_HV.

The following is a more detailed explanation of the circuit schematic of this embodiment.

SUPPLY_HV is a node connected to the highest voltage level (VH). SUPPLY_MV is a node connected to the medium voltage level (VM). OUT_HV is the output of this high voltage switch circuit (HVS). OUT_INT_HV is an internal node of this HVS and is connected to the gate of n-mos transistor MN7. P_CASC is a node, having voltage level VP. Voltage level VP may be a partitioned voltage from the highest voltage level (VH). IN_LV is an input low voltage logic signal whose value may indicate the state of the switch (HVS). IN_LV can be logic 0 or logic 1.

Further, in this embodiment each of the p-mos transistors has the bulk and source terminals shorted together. Each of the n-mos transistors can have the bulk connected to ground, or alternatively can have the bulk and the source shorted together.

Further, in this embodiment all of the transistors involved in this circuit can be high voltage transistors, except MN6. MN6 is a low voltage n-mos transistor in the embodiment shown in FIG. 6 but is a high voltage n-mos transistor in the embodiment shown in FIG. 8.

An example of the operation of the embodiment of HVS shown in FIG. 6 is now explained. The operation of this HVS can be explained with reference to two possible states in which the HVS can be found—for example, one state when IN_LV is logic 0 and another state when IN_LV is logic 1. For simplicity in explaining the operation, it will be assumed that IN_LV is a first input, and subsequently SUPPLY_HV is ramped up from a low voltage value to the target high voltage value (VH). However, such is not a limitation to this embodiment because, as will be explained later, the state of HVS can still change even after SUP-PLY_HV has fully developed to VH.

The operation of HVS when IN_LV is at a high logic state is now explained. When IN_LV is at a high logic state, internal node OUT_INT_HV is connected to ground through n-mos transistors MN5 and MN6, while output node OUT_HV is connected to SUPPLY_HV through p-mos transistors MP1 and MP3. Then, N-mos transistor MN7 will be in the off-state because OUT_INT_HV is connected to ground, which results in SUPPLY_MV not being connected to output node OUT_HV.

When IN_LV is at a high logic state, the state of protection sub-circuit C3 may have the following characteristics. When IN_LV is at a high logic state, transistor MN4 is turned on. Then, node RC can be potentially connected to ground through p-mos transistor MP6. However, p-mos transistor MP6 is turned on only when node RC rises above the voltage level equal to "VP+Vth(MP6)," where VP is the voltage level at node P_CASC and Vth(MP6) is the threshold voltage of p-mos transistor MP6. Further, node RC can be potentially connected to SUPPLY_HV through n-mos transistor MN2. However, n-mos transistor MN2 is turned on only when node RC falls below the voltage level equal to "VP−Vth(MN2)," where VP is the voltage level at node P_CASC and Vth(MN2) is the threshold voltage of n-mos transistor MN2. Accordingly, the voltage level at node RC, when IN_LV is at a high logic state, can have the following relation:

$$VP-Vth(MN2) \leq V(RC) \leq VP+Vth(MP6) \qquad [R1]$$

When IN_LV is at a high logic state, the state of protection sub-circuit C1 may have the following characteristics. When IN_LV is at a high logic state, node IN_LV_N is at a low logic state, and n-mos transistor MN3 is turned off. Then, node LC becomes unable to pass current through MP5 and MN3 to ground. This results in the voltage level at node LC being not limited to the maximum voltage level set by this protection sub-circuit C1. It is to be noted that node LC still may not exceed the high voltage (VH) supplied from SUPPLY_HV. Further, node LC can be potentially connected to SUPPLY_HV through n-mos transistor MN1. However, n-mos transistor MN1 is turned on only when node LC falls below the voltage level equal to "VP−Vth(MN1), where VP is the voltage level at node P_CASC and Vth(MN1) is the threshold voltage of n-mos transistor MN1. Accordingly, the voltage level at node LC, when IN_LV is at a high logic state, can have the following relation:

$$VP-Vth(MN1) \leq V(LC) \leq VH \qquad [R2]$$

Accordingly, when SUPPLY_HV is raised to the high voltage level (VH), gate terminals for both p-mos transistors MP1 and MP3 are grounded and, accordingly, the voltage at SUPPLY_HV (which has been raised to the high voltage) can be passed to node LC and finally to node OUT_HV.

However, the rising of the voltage level at node OUT-HV may turn off p-mos transistors MP2 and MP4. In this condition, HVS can have the following characteristics:

OUT_HV is at the high voltage level (VH) supplied from SUPPLY_HV. Further, the path for the medium voltage level (VM) supplied from SUPPLY_MV to OUT_HV through n-mos transistor MN7 is interrupted, because OUT_INT_HV is grounded.

Figure 7A:
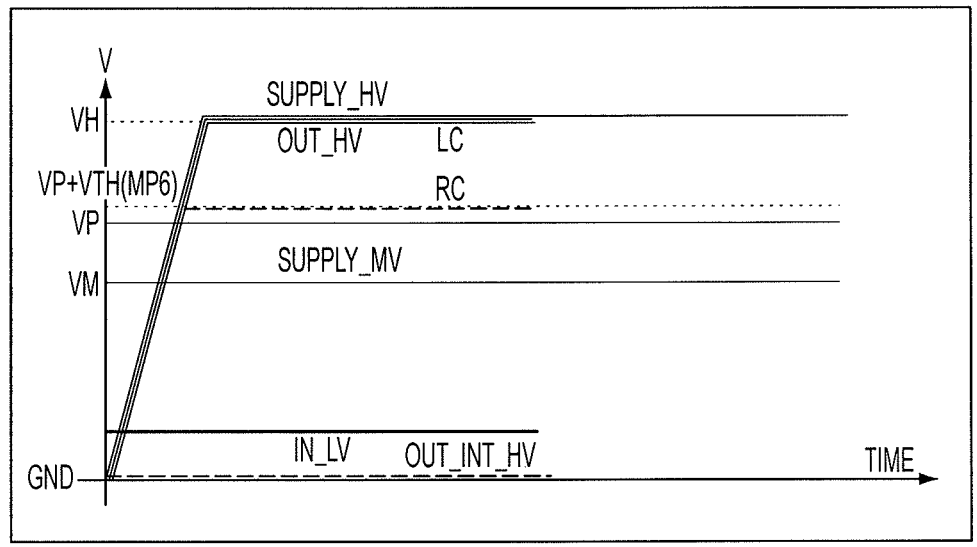
FIG. 7a illustrates an example of waveform behavior of select nodes in proposed HVS when IN_LV is at a high logic state.

FIG. 7a shows an example of waveform behavior of the nodes in this HVS when IN_LV is at a high logic state.

In this circuit schematic when IN_LV is at a high logic state, the operation safety for p-mos transistor junction can be guaranteed. For example, P-mos transistors MP1 and MP3 of sub-circuit C2 and p-mos transistor MP5 of sub-circuit C1 may be made safe because the voltage difference between their source/drain and the bulk terminals is substantially null—that is, substantially zero. This is because transistors MP1 and MP3 have ground on their gates, i.e. MP1 and MP3 are in on state allowing VH to pass on both nodes LC and OUT_HV. Therefore drain and source terminals for both MP1 and MP3 is=VH. Transistor MP5 has VP on its gate. If VP is chosen sufficiently low (VP<VH−Vth (MP5)), transistor MP5 is also in on state allowing the voltage on node LC (source of transistor MP5) to pass also on the drain of transistor MP5. Therefore source and drain terminals also for transistor MP5 are both at VH.

Furthermore, p-mos transistors MP2 and MP4 of sub-circuit C2 and p-mos transistor MP6 of sub-circuit C3 may be made safe if VP is chosen properly. For example, VP can be selected from values that satisfy the following condition/relation:

$$VH-Vjmax+Vth(MN2)<VP<Vjmax-Vth(MP6) \qquad [R3]$$

where Vjmax is the maximum sustainable voltage difference between p-mos junctions—that is, the voltage difference between source/drain and bulk terminal of a p-mos high voltage transistor. For example, if VH=20V, Vth(MN2)=1V, Vth(MP6)=1.5V, Vjmax=14V, then the condition becomes 7V<VP<12.5V. Accordingly, the voltage value of around 10V can be safely selected for VP. VP may be obtained by a partition (e.g., a half in this example) from the voltage value of VH.

Table 1 illustrates examples of voltage levels at various terminals of p-mos transistors when IN_LV is high. Specifically, Table 1 shows comprehensive relations among the gate bias, bulk-source voltage difference and bulk-drain voltage difference of p-mos transistors when IN_LV is at a high logic state. It is to be noted that V(RC) in Table 1 represents the voltage level at node RC when IN_LV is at a high logic state. This voltage level may be limited by sub-circuit C3 according to relation [R1].

TABLE 1

| P-mos | Gate bias | Bulk bias | Source bias | Drain bias | Bulk/Source difference | Bulk/Drain difference |
|---|---|---|---|---|---|---|
| MP1 | 0 | VH | VH | VH | 0 | 0 |
| MP2 | VH | VH | VH | V(RC) | 0 | VH − V(RC) |
| MP3 | 0 | VH | VH | VH | 0 | 0 |
| MP4 | VH | V(RC) | V(RC) | 0 | 0 | V(RC) |
| MP5 | VP | VH | VH | VH | 0 | 0 |
| MP6 | VP | V(RC) | V(RC) | 0 | 0 | V(RC) |

An example of the operation of HVS when IN_LV is at a low logic state is now explained. When IN_LV is at a low logic state, both node OUT_HV and node OUT_INT_HV are left floating.

When IN_LV is at a low logic state, the state of protection sub-circuit C3 may have the following characteristics. When IN_LV is at a low logic state, transistor MN4 is turned off. Then, node RC becomes unable to pass current through MP6 and MN4 to ground. This results in the voltage level at node RC being not limited to the maximum voltage level set by this protection sub-circuit C3. It is to be noted that node RC may not still exceed the high voltage level (VH) supplied from SUPPLY_HV. Further, node RC can be potentially connected to SUPPLY_HV through n-mos transistor MN2. However, n-mos transistor MN2 is turned on only when node RC falls below the voltage level equal to "VP−Vth (MN2), where VP is the voltage level at node P_CASC and Vth(MN2) is the threshold voltage of n-mos transistor MN2.

Accordingly, the voltage level at node RC, when IN_LV is at a low logic state, can have the following relation:

$$VP-Vth(MN2) \leq V(RC) \leq VH \quad [R4]$$

When IN_LV is at a low logic state, the state of protection sub-circuit C1 may have the following characteristics. When IN_LV is at a low logic state, IN_LV_N is at a high logic state. Then, transistor MN3 is turned on. Then, node LC can be potentially connected to ground through p-mos transistor MP5 and n-mos transistor MN3. However, p-mos transistor MP5 is turned on only when node LC rises above the voltage level equal to "VP+Vth(MP5)," where VP is the voltage level at node P_CASC and Vth(MP5) is the threshold voltage of p-mos transistor MP5. Further, node LC can also be potentially connected to SUPPLY_HV through n-mos transistor MN1. However, n-mos transistor MN1 is turned on only when node LC falls below the voltage level equal to "VP−Vth(MN1)," where VP is the voltage level at node P_CASC and Vth(MN1) is the threshold voltage of n-mos transistor MN1. Accordingly, the voltage level at node LC, when IN_LV is at a low logic state, can have the following relation:

$$VP-Vth(MN1) \leq V(LC) \leq VP+Vth(MP5) \quad [R5]$$

When high voltage supply line SUPPLY_HV is raised, the high voltage level (VH) tends to pass onto node RC and node OUT_INT_HV because node OUT_HV tends to stay at a lower voltage level than node OUT_INT_HV. That is, node OUT_HV is loaded with capacitor C0 and therefore node OUT_INT_HV has lower capacitance than node OUT_HV.

In view of the above trend of the voltage flow, p-mos transistors MP1 and MP3 are turned off while p-mos transistor MP2 and MP4 are turned on. In this condition, HVS can have the following characteristics:

OUT_INT_HV is at the high voltage level (VH) of line SUPPLY_HV. Accordingly, the path for the medium voltage level (VM) supplied from SUPPLY_MV to node OUT_HV through n-mos transistor MN7 can be established. Thus, the voltage level at node OUT_HV may reach the medium voltage level (VM).

Figure 7B:
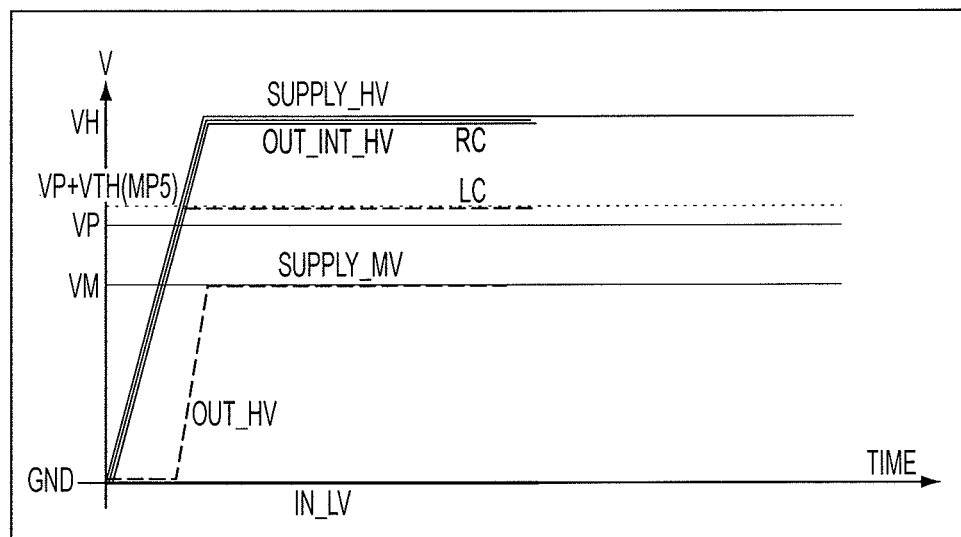
FIG. 7b illustrates an example of waveform behavior of select nodes in proposed HVS when IN_LV is at a low logic state.

FIG. 7b shows an example of waveform behavior of the nodes in this HVS when IN_LV is at a low logic state.

In this circuit schematic when IN_LV is at a low logic state, the operation safety for p-mos transistor junction can be guaranteed. For example, p-mos transistors MP2 and MP4 of sub-circuit C2 and p-mos transistor MP6 of sub-circuit C3 may be made safe because the voltage difference between their source/drain and their bulk terminals is null—that is, zero. This is because transistors MP2 and MP4 have ground on their gates, i.e. MP2 and MP4 are in on state allowing VH to pass on both nodes RC and OUT_INT_HV. Therefore drain and source terminals for both MP2 and MP4 is=VH. Transistor MP6 has VP on its gate. If VP is chosen sufficiently low (VP<VH−Vth(MP6)), transistor MP6 is also in on state allowing the voltage on node RC (source of transistor MP6) to pass also on the drain of transistor MP6. Therefore source and drain terminals also for transistor MP6 are both at VH.

Furthermore, p-mos transistors MP1 and MP3 of sub-circuit C2 and p-mos transistor MP5 of sub-circuit C1 may be made safe if VP is chosen properly. For example, VP can be selected from values that satisfy the following condition/relation:

$$VH-Vjmax+Vth(MN1)<VP<Vjmax-Vth(MP5) \quad [R6]$$

where Vjmax is the maximum sustainable voltage difference between p-mos junctions—that is, the voltage difference between source/drain and bulk terminal of a p-mos high voltage transistor. For example, if VH=20V, Vth(MN1)=1V, Vth(MP5)=1.5V, Vjmax=14V, then the condition becomes 7V<VP<12.5V. Accordingly, the voltage value of around 10V can be safely selected for VP. VP may be obtained by a partition (e.g., a half in this example) from the voltage value of VH.

Table 2 illustrates examples of voltage levels at various terminals of p-mos transistors when IN_LV is low. Specifically, Table 2 shows comprehensive relations among the gate bias, bulk-source voltage difference and bulk-drain voltage difference of p-mos transistors when IN_LV is at a low logic state. It is to be noted that V(LC) in Table 2 represents the voltage level at node LC when IN_LV is at a low logic state. This voltage level may be limited by sub-circuit C1 according to relation [R5].

TABLE 2

| P-mos | Gate bias | Bulk bias | Source bias | Drain bias | Bulk/Source difference | Bulk/Drain difference |
|---|---|---|---|---|---|---|
| MP1 | VH | VH | VH | V(LC) | 0 | VH − V(LC) |
| MP2 | 0 | VH | VH | VH | 0 | 0 |
| MP3 | VH | V(LC) | V(LC) | 0 | 0 | V(LC) |
| MP4 | 0 | VH | VH | VH | 0 | 0 |
| MP5 | VP | V(LC) | V(LC) | 0 | 0 | V(LC) |
| MP6 | VP | VH | VH | VH | 0 | 0 |

It may be noted that whichever state the high voltage switch (HVS) circuit may be found in, there can be no conductive path between SUPPLY_HV and ground through protection sub-circuits C1 and C3. This can be attributed to the fact that n-mos and p-mos transistors between SUPPLY_HV and ground may never all be turned on simultaneously.

Further, it may be noted that in order to ensure proper turning-on of p-mos transistors MP2 and MP4 in sub-circuit C2 when IN_LV is at a low logic state, the medium voltage level (VM) may be made lower than the voltage level equal to "VH−Vthp." Vthp represents the maximum threshold voltage of MP2 and MP4. This condition can usually be satisfied in most practical applications.

Second Embodiment

As explained earlier, the operation of this HVS does not require that IN_LV be the first input, and subsequently SUPPLY_HV is ramped up from a low voltage value to the target high voltage value (VH). Instead, the state of this HVS can in fact change even after SUPPLY_HV has fully developed to the high voltage value (VH). When the high voltage level (VH) is first fully developed on line SUPPLY_HV before IN_LV is input, there can be a risk of a hot-switching effect of high voltage n-mos transistors.

The hot switching effect of the high voltage n-mos transistors is generally undesired. This effect may include transistor oxide damage or degradation. This effect may be caused by electrons being accelerated from a high potential difference between the drain and source terminals of an n-mos transistor and injected to the gate oxide by a high voltage signal applied on the gate terminal. Accordingly, this hot switching effect can occur when an n-mos transistor is turned on with a high voltage difference between its drain and source. Typically, there is a maximum Vds specification for n-mos transistors to avoid this hot switching effect during the turning on stage of these n-mos transistors. This maximum Vds is hereinafter referred to as Vdsmax.

In order to prevent this hot switching effect, the proposed high voltage switching circuit (HVS) may be configured so as to allow changing its state even when the high voltage level (VH) has already been fully developed on SUPPLY_HV and/or the medium voltage level (VM) has already been fully developed on SUPPLY_MV. To achieve this, the HVS may employ additional cascaded n-mos transistors.

Figure 8:
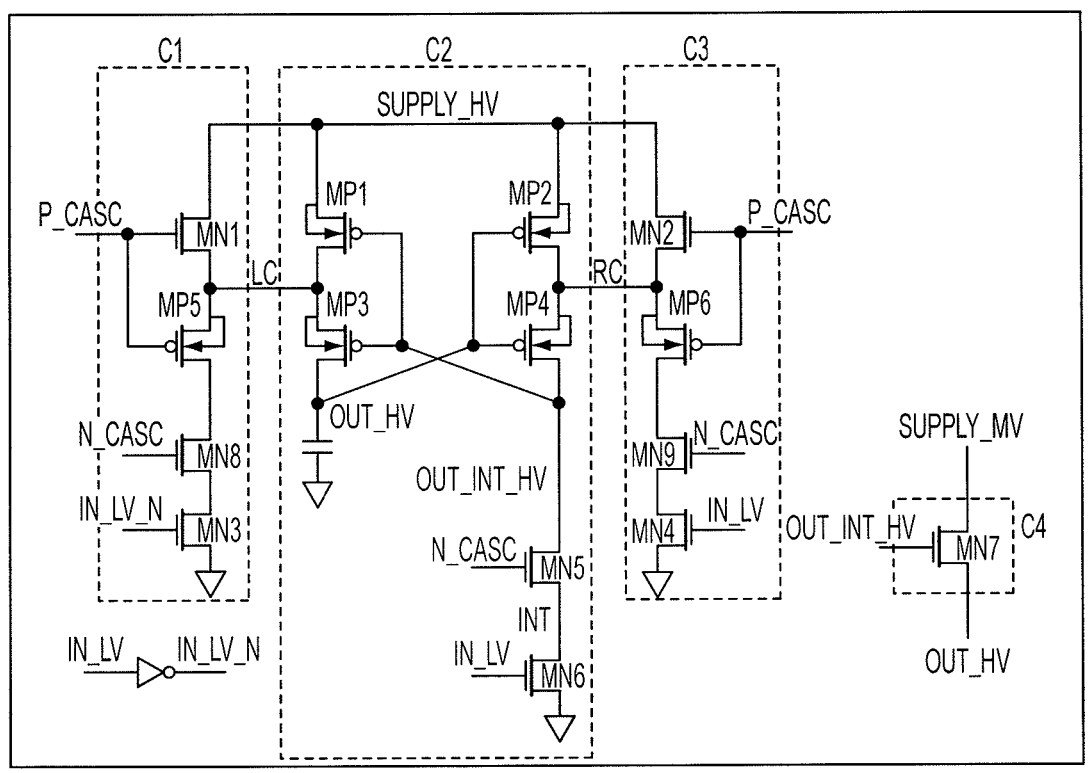
FIG. 8 illustrates an example of proposed HVS circuit schematic with additional cascaded n-mos transistors.

FIG. 8 shows an example of a proposed high voltage switch (HVS) circuit schematic with additional cascaded n-mos transistors. This circuit schematic employs a very similar circuit schematic to that shown in FIG. 6 but with additional cascaded n-mos transistors. These cascaded n-mos transistors are MN8 in sub-circuit C1 and MN9 of sub-circuit C3. In the circuit schematic in FIG. 8 the cascaded n-mos transistors can be used to protect n-mos transistor MN6 of sub-circuit C2, n-mos transistor MN3 of sub-circuit C1 and n-mos transistor MN4 of sub-circuit C3 from the above-explained hot switching phenomenon.

Specifically, n-mos transistors MN5, MN8 and MN9 have their gate terminals connected to node N_CASC. The voltage level to be applied to node N_CASC is hereinafter referred to as voltage level VN. Then, a careful selection of the voltage value for VN may avoid the hot switching effect on n-mos transistors MN6, MN3, MN4, MN5, MN8 and MN9. Specifically, the value for VN can be selected from the range of values that can satisfy the following condition/relation:

$$VH-Vdsmax+Vthn<VN<Vdsmax-Vthn \qquad [R7]$$

where VH is the high voltage level, Vdsmax is the maximum voltage difference allowed for an n-mos between its drain and source and Vthn is the threshold voltage for an n-mos transistor.

The risk of hot switching effect in the embodiment shown in FIG. 6 and its prevention in the embodiment shown in FIG. 8 are explained now with examples. In the circuit schematic shown in FIG. 6, the below conditions are assumed:

SUPPLY_HV=20V,SUPPLY_MV=9V,P_CASC=10V, IN_LV=1.8V

IN_LV_N=0V,OUT_INT_HV=0,RC≈10V,Drain of MN4=0V,

OUT_HV=20V,LC=20V,Drain of MN3=20V

Then, when signal IN_LV transitions from a high logic state to a low logic state, the following changes may occur:

IN_LV=1.8V→0V

IN_LV_N=0V→1.8V

MN3=Off→On

Drain of MN3=20V→0V

As shown above, n-mos transistor MN3 turns on with such a high voltage difference, equal to 20V, between its drain and source terminals. This may put MN3 at risk of hot switching.

On the other hand, the embodiment shown in FIG. 8 may prevent this risk of hot switching effect. To illustrate this, the below conditions are assumed for the circuit schematic shown in FIG. 8:

SUPPLY_HV=20V,SUPPLY_MV=9V,P_CASC=10V, N_CASC=10V,

IN_LV=1.8V,IN_LV_N=0V,OUT_INT_HV=0, RC≈10V,Drain of MN4=0V,

Drain of MN9=0V,OUT_HV=20V,LC=20V,Drain of MN3=10V−Vth(MN8),

Drain of MN8=20V.

Further, Vth(MN8)=1V. Therefore, drain of MN3=10V−1V=9V.

Then, when signal IN_LV transitions from a high logic state to a low logic state, the following changes may occur:

IN_LV=1.8V→0V

IN_LV_N=0V→1.8V

MN3=Off→On

MN8=Off→On

Drain of MN8=20V→0V

Source of MN8=9V→0V

Drain of MN3=9V→0V

As shown above, both transistors MN3 and MN8 can turn on with reduced voltage differences between their drain and source terminals. Specifically, transistor MN8 may turn on with the voltage difference of 11V, whereas transistor MN3 may turn on with the voltage difference of 9V.

It may be noted that further reduction is possible when the voltage differences of 11V and 9V are still considered to be high, therefore at risk of hot switching effect. To further reduce the voltage differences, additional cascade n-mos transistors may be employed. While the embodiment shown in FIG. 8 used two cascade n-mos transistors to prevent the hot switching effect, more than two cascade elements may be used to further reduce the voltage differences between the drain and source terminals of transistors. Such cascading technique may be done in the same way disclosed in the embodiment shown in FIG. 8.

FIG. 9 shows an example of waveform behavior representing the HVS changing its state after SUPPLY_HV has fully developed to VH.

Figure 9A:
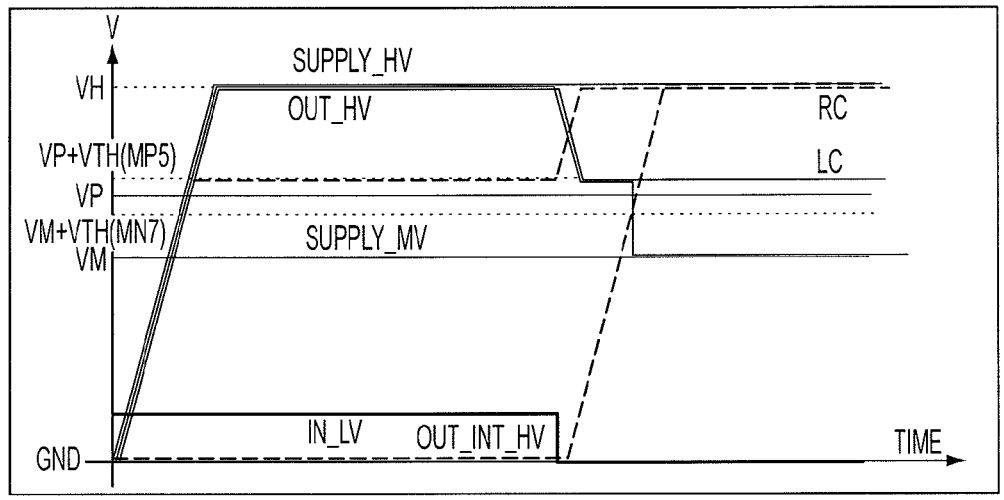
FIG. 9a illustrates an example of waveform behavior of select nodes in proposed HVS when the switch output node is changing from VH to VM.

Particularly, FIG. 9a shows an example of the case where the switch output node, OUT_HV, is changing from VH to VM. In this case, signal IN_LV is changed from a logic high state to a low logic state. Both nodes LC and OUT_HV then start discharging through MP3, MP5, MN8 and MN3 while nodes RC and line OUT_INT_HV start charging towards the high voltage level (VH) through MP2 and MP4. Both nodes LC and OUT_HV stop discharging when they reach the voltage level equal to "VP+Vth(MP5)," where VP is the voltage level at node P_CASC and Vth(MP5) is the threshold voltage of p-mos transistor MP5. Further, when the voltage level of line OUT_INT_HV rises above the voltage level equal to "VM+Vth(MN7)," where VM is the medium voltage level and Vth(MN7) is the threshold voltage of n-mos transistor MN7, then VM is passed to line OUT_HV.

Figure 9B:
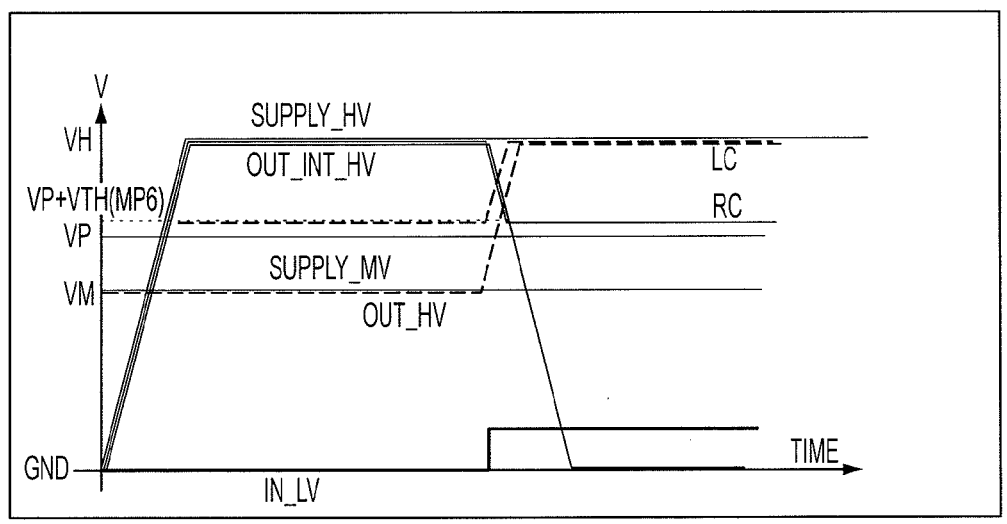
FIG. 9b illustrates an example of waveform behavior of select nodes in proposed HVS when the switch output node is changing from VM to VH.

On the other hand, FIG. 9b shows an example of the case where the switch output node, OUT_HV, is changing from VM to VH. In this case, signal IN_LV is changed from a logic high state to a low logic state. Both nodes RC and OUT_INT_HV start discharging through MP4, MP6, MN9 and MN4, while nodes LC and OUT_HV start charging towards the high voltage level (VH) through MP1 and MP3. Node RC stops discharging when it reaches the voltage level equal to "VP+Vth(MP6)," where VP is the voltage level at node P_CASC and Vth(MP6) is the threshold voltage of p-mos transistor MP6. Meanwhile, node OUT_INT_HV continues discharging until it reaches the ground voltage level. Accordingly, the voltage level at node OUT_HV changes from VM to VH.

Third Embodiment

It may be noted that proposed circuit schematics shown in FIGS. 6 and 8 may require that the medium voltage level (VM) be inferior to the voltage level equal to "VP−Vth (MN1)," where VP is the voltage level at node P_CASC and Vth(MN1) is the threshold voltage of n-mos transistor MN1. That is, when a voltage value higher than "VP−Vth(MN1)" is used for VM, the drain to bulk junction of p-mos transistor MP3 might be forward-biased when it is passing VM to output node OUT_HV, when IN_LV is at a low logic state. For example, if VP is chosen to be 10V and Vthn (threshold voltage of n-mos) is around 1V, then the maximum voltage value that may be applied to SUPPLY_MV becomes 9V. This 9V is VM.

The above limitation may be removed by utilizing additional transistors.

Figure 10:
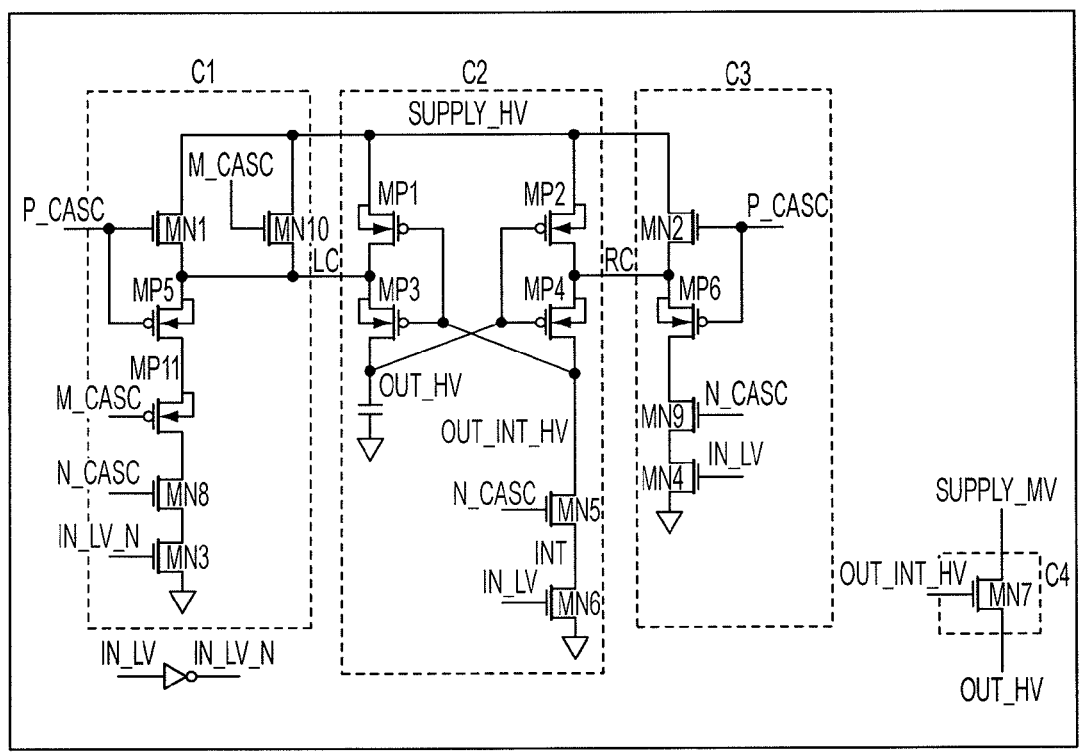
FIG. 10 illustrates an example of proposed HVS with additional transistors so that the voltage level of VM can be higher than cascade voltage.

FIG. 10 shows an example of proposed HVS with additional transistors used to mitigate the limitation on VM. Specifically, the circuit schematic shown in FIG. 10 adds two additional transistors in sub-circuit C1. The added transistors are n-mos transistor MN10 and p-mos transistor MP11. Then, the gate terminals for both of these transistors, M_CASC, may be connected to SUPPLY_MV. Accordingly, the medium voltage level (VM) supplied from SUP-PLY_MV may be passed on to node M_CASC. Both transistors MN10 and MP11 are high voltage transistors. MN10 may be a low threshold transistor.

If voltage level VM is applied to SUPPLY_MV and M_CASC is higher than cascade voltage (VP−Vth(MN1)), then the voltage level at node LC is limited within the range given by the following relation:

$$VM-Vth(MN10)<V(LC)<VM+Vth(MP11) \quad [R8]$$

where Vth(MN10) is the threshold voltage of n-mos transistor MN10, V(LC) is the voltage level at node LC, and Vth(MP11) is the threshold voltage of p-mos transistor MP11.

Then, the drain to bulk junction of MP3 may not be forward-biased even when VM is passed onto output node OUT_HV. Moreover, since VM is still higher than "VP−Vth(MN1)", the operation of p-mos transistors MP1 and MP3 may be safe.

The limit on maximum voltage value of VM in the embodiment shown in FIG. 6 and its removal/mitigation in the embodiment shown in FIG. 10 are explained now with examples. In the circuit schematic shown in FIG. 6, the below conditions may be assumed:

SUPPLY_HV=20V,SUPPLY_MV=6V,P_CASC=10V, IN_LV=0V

IN_LV_N=1.8V,OUT_INT_HV=20V,RC=20V, OUT_HV=6V

LC≈10V.

The limit on the maximum voltage value for VM becomes visible when it is assumed that SUPPLY_MV is raised to the voltage value of around 15V. Then, the following conditions may occur:

IN_LV=0V,IN_LV_N=1.8V,OUT_INT_HV=20V, RC=20V

OUT_HV=15V,LC≈10V.

Then, the voltage level of the drain terminal of MP3 becomes higher than that of its bulk terminal, and therefore the drain-to-bulk junction would be forward-biased. Accordingly, the maximum voltage value for VM is limited to be around "VP−Vth(MN1)," where VP is the voltage level at node P_CASC and Vth(MN1) is the threshold voltage of n-mos transistor MN1.

On the other hand, the limitation on the maximum value for VM may be removed in the embodiment shown in FIG. 10. In the circuit schematic shown in FIG. 10, the below conditions may be assumed:

SUPPLY_HV=20V,SUPPLY_MV=6V,P_CASC=10V, IN_LV=0V

M_CASC=SUPPLY_MV=6V,IN_LV_N=1.8V, OUT_INT_HV=20V,

RC=20V,OUT_HV=6V,LC≈10V.

Then, n-mos transistor MN10 may be turned off as node LC is raised to the voltage level of around 10V through n-mos transistor MN1. P-mos transistor MP11 is on, but MP5 is limiting the voltage level of node LC at around 10V.

Further, it may be safe even when the voltage level supplied to SUPPLY_MV is higher than that supplied to P_CASC. If SUPPLY_MV=M_CASC=15V, (therefore, greater than P_CASC), the following conditions may occur:

IN_LV=0V,IN_LV_N=1.8V,OUT_INT_HV=20V, RC=20V

OUT_HV=15V,LC≈15V.

In this case, n-mos transistor MN1 is turned off as node LC is raised to the voltage level of around 15V through n-mos transistor MN10. P-mos transistor MP5 is on, but MP11 is still limiting the voltage level of node LC at around 15V.

Instead of using embodiments of FIG. 6 and FIG. 8 to build a high-voltage switch which connects to the output one out of two voltage levels such as SUPPLY_HV and SUP-PLY_MV, it is possible to build a high-voltage switch that is able to pass one voltage such as SUPPLY_HV or to leave the output of the switch in a high-impedance state. This can be accomplished simply by removing sub-circuit C4 in both embodiments of FIG. 6 and FIG. 8.

In other applications, the proposed circuit schematics in FIGS. 6 and 8 may be used with one or more elevators, which then can be used to allow switching the output signal, OUT_HV, among one or more different voltage values.

Figure 11:
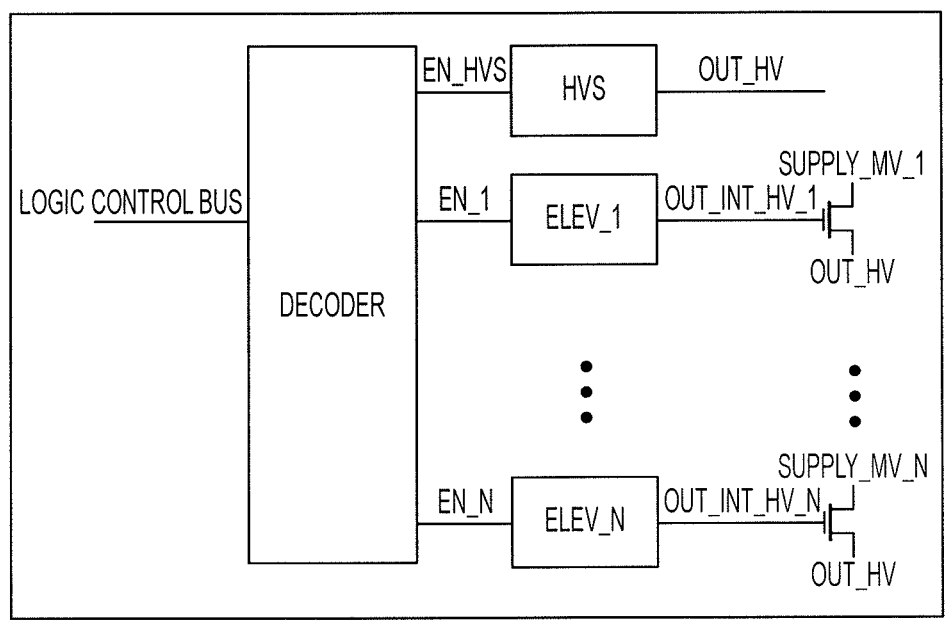
FIG. 11 illustrates an example of proposed HVS where a plurality of medium voltages lower than the high voltage level (VH) may be selected and passed onto the output node.

FIG. 11 shows an example of the proposed HVS circuit schematic with one or more elevators added to allow switching of the output signal among several different voltage values. It may be noted that the highest voltage value (VH) among all available voltage values is the one that is supplied by the proposed HVS. All the other lower voltage values are supplied by n-mos pass transistors driven by elevators, as shown in FIG. 11. A logic control bus is input to a decoder to select the line that is to be switched so as to be connected with output node OUT_HV. It can also be noted that the block HVS corresponds to one of the circuit reported in FIG. 6 or 8 without sub-circuit C4.

It may be further noted that the circuit schematic shown in FIG. 11 may require the maximum medium voltage to be passed onto the output node be inferior to or lower than the cascade voltage. The reasons for this are explained above. However, this requirement may also be removed.

Figure 12:
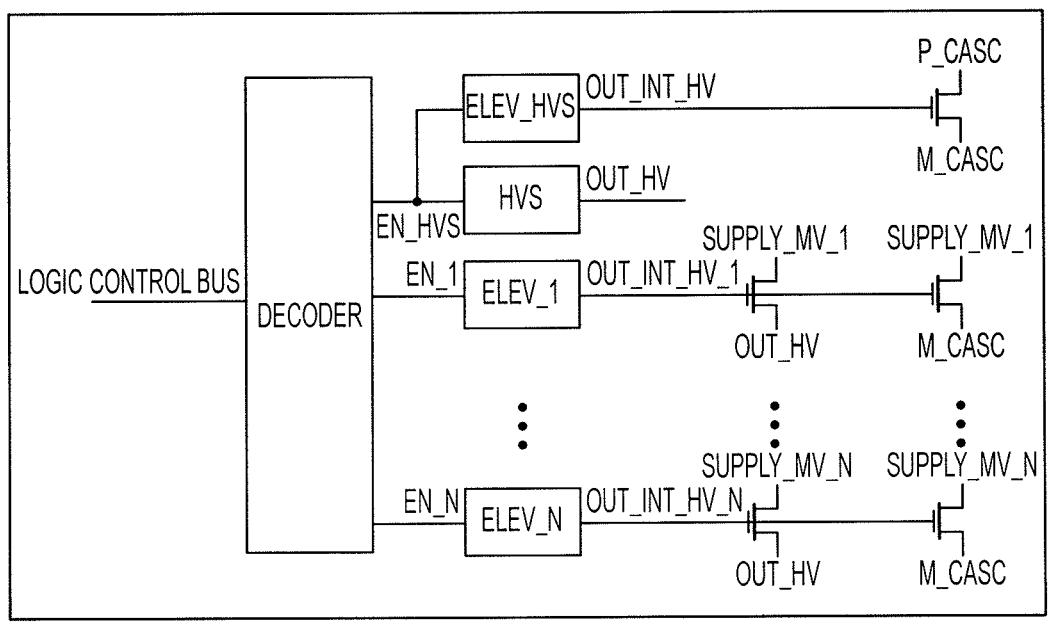
FIG. 12 illustrates an example of proposed HVS where a plurality of medium voltages lower than VH may be selected and passed onto the output node, and some or all of the medium voltages may be higher than cascade voltage.

FIG. 12 shows an example of the proposed HVS circuit schematic that does not require the maximum medium voltage to be inferior to the cascade voltage. In this circuit schematic, node M_CASC can be connected to medium voltage supply lines SUPPLY_MV[i]. Medium voltage supply lines SUPPLY_MV[i] may be connected to output node OUT_HV. Where one supply line SUPPLY_MV[i] is chosen to be connected to output node OUT_HV, the same supply line can then be delivered to lines M_CASC. This connection may protect the drain to bulk junctions of p-mos transistors inside the HVS (represented by block HVS). This effect has been explained in more detail earlier. With this kind of circuit architecture, the drain junctions of local p-mos transistors in the HVS may be made safe irrespective of the medium voltage level of medium voltage supply lines SUPPLY_MV[i].

Further, it may be noted that if SUPPLY_HV is to be connected to output node OUT_HV, it may be achieved by shorting node P_CASC and node M_CASC together.

Figure 13:
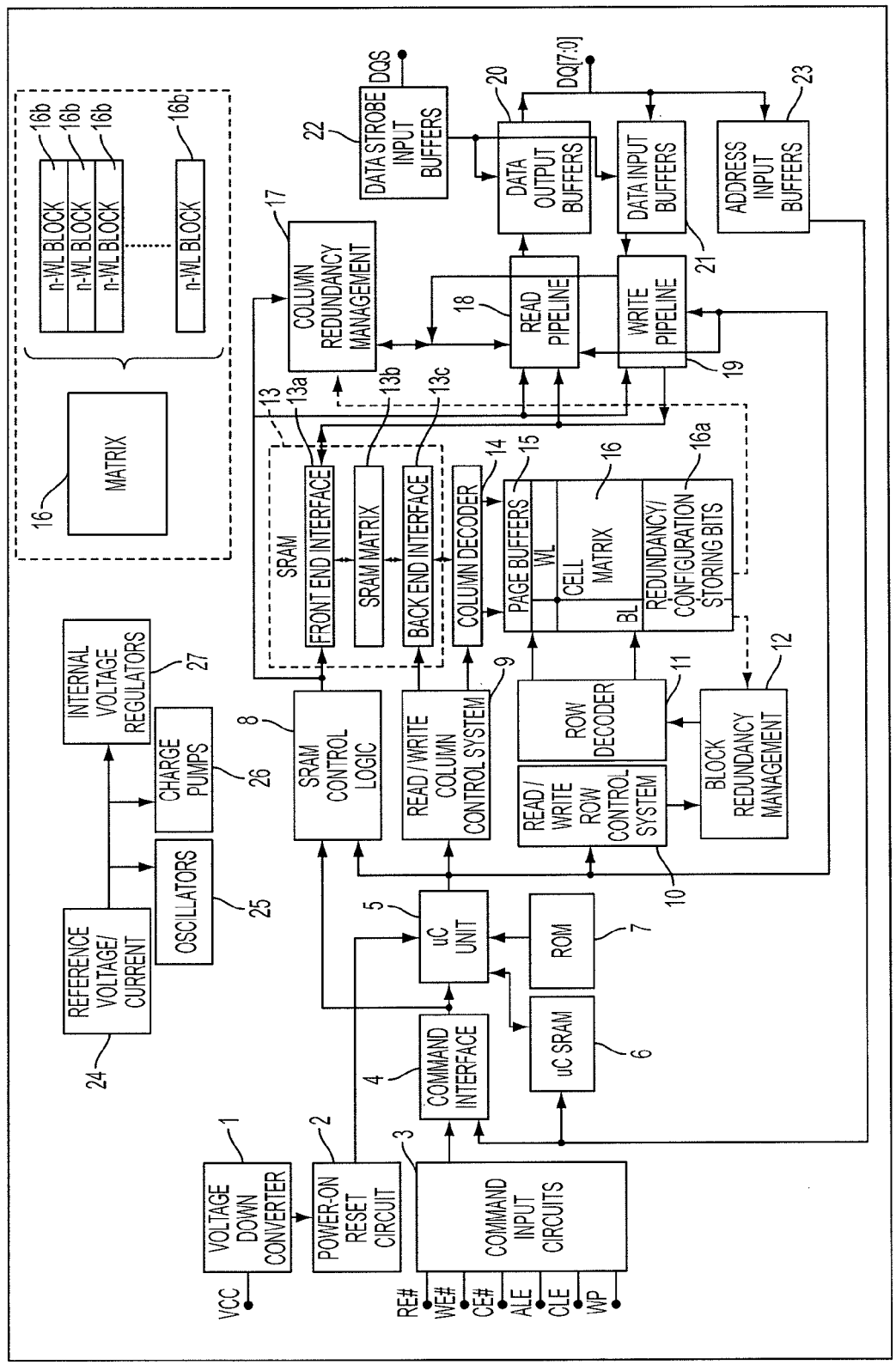
FIG. 13 illustrates an example of circuit schematic of a chip.

FIG. 13 shows an example of a circuit schematic of a semiconductor chip. The proposed HVS circuit schematics may be found in block 9 or 10.

Figure 14:
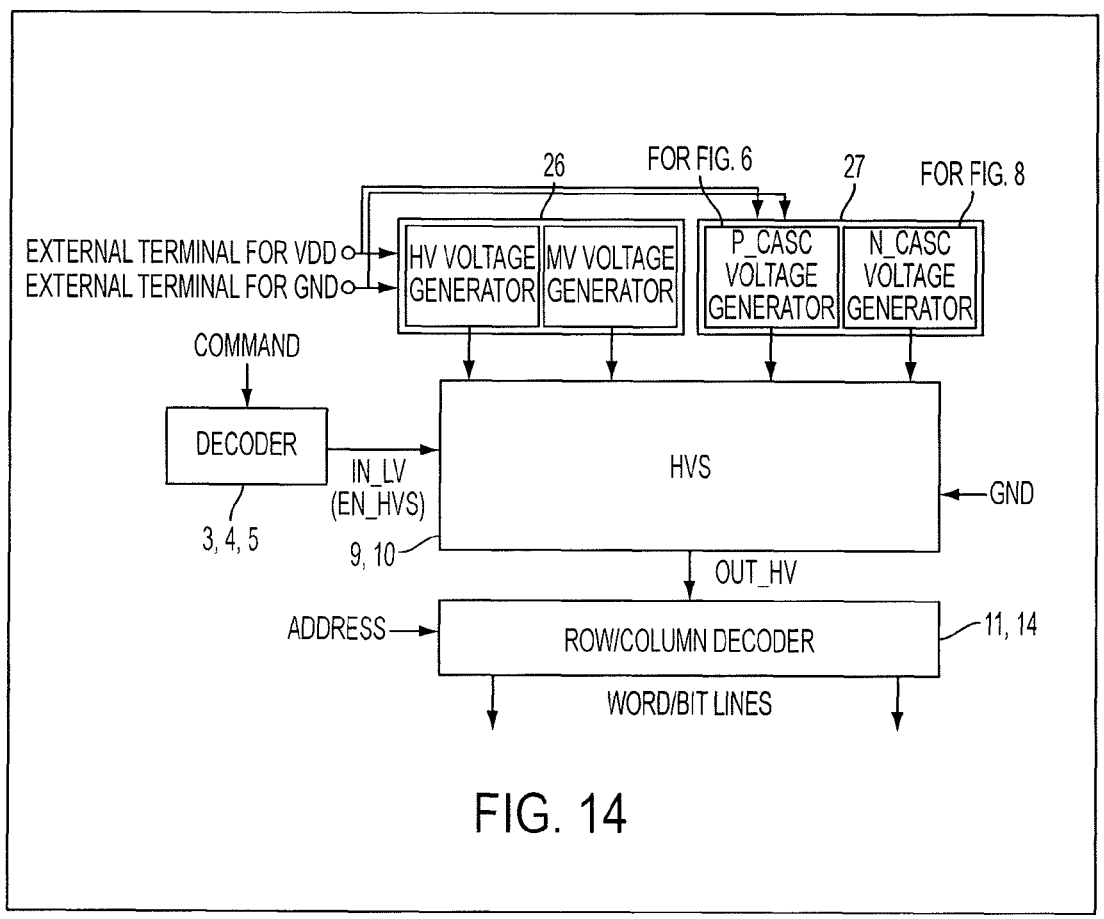
FIG. 14 illustrates an example of circuit schematic of a chip showing the relationship between the proposed HVS and the system shown in FIG. 13.

FIG. 14 shows an example of a circuit schematic of a semiconductor chip illustrating the relationship between the proposed HVS and the system shown in FIG. 13. The proposed HVS may be any one of the embodiments disclosed above or any embodiments disclosed above with obvious modifications.

It may be possible to apply the above explained concept to make a multi-voltage switch where two or more different voltage inputs are available for selection and the selected voltage is passed onto the output line.

One skilled in the relevant art will recognize that many other possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A device comprising:
   a first PMOS transistor coupled between a power source line and a first node and including a control gate coupled to a second node and a back gate coupled to the power source line;
   a second PMOS transistor source-drain coupled between the first node and an output node and including a control gate coupled to the second node and a back gate coupled to the first node;
   a first NMOS transistor source-drain coupled between the power source line and the first node and including a control gate supplied with a first voltage;
   a third PMOS transistor is coupled across a connection path to the first node with neither the first PMOS transistor nor the second PMOS transistor being included in the connection path between the third PMOS transistor and the first node, and including a control gate supplied with the first voltage;
   a fourth PMOS transistor coupled between the power source line and a third node and including a control gate coupled to the output node and a back gate coupled to the power source line;
   a fifth PMOS transistor coupled between the third node and the second node and including a control gate coupled to the output node and a back gate coupled to the third node;
   a second NMOS transistor coupled to the third PMOS transistor and including a control gate supplied with a second voltage;
   a third NMOS transistor coupled between the power source line and the first node and including a control gate coupled to a second power source line; and
   a sixth PMOS transistor coupled between the third PMOS transistor and second NMOS transistor and including a control gate coupled to the second power source line;
   wherein the second voltage is smaller than a Vdsmax−a threshold voltage of at least one of the first and second NMOS transistors,
   wherein the second voltage is larger than the power source line voltage−the Vdsmax+the threshold voltage or at least one of the first and second NMOS transistors, and
   wherein the Vdsmax is a maximum voltage to prevent hot switching effect when turning on at least the one of the first and second NMOS transistors.

2. The device as claimed in claim 1,
   wherein the first voltage is smaller than a Vjmax−a threshold voltage of the third PMOS transistor and larger than a voltage on the power source line−Vjmax+a threshold voltage of the first NMOS transistor, and
   wherein the Vjmax is a maximum sustainable voltage difference between source, drain and bulk terminals for the first to third PMOS transistors.

3. The device as claimed in claim 1, further comprising:
   a fourth NMOS transistor coupled between the power source line and the third node and including a control gate supplied with the first voltage; and
   a seventh PMOS transistor coupled to the third node and a fourth node and including a control gate supplied with the first voltage.

4. The device as claimed in claim 3, further comprising:
   a fifth NMOS transistor coupled between a second power source line and the output node and including a control gate coupled to the second node.

5. The device as claimed in claim 1, further comprising:
   a sixth NMOS transistor coupled to the fifth PMOS transistor and including a control gate supplied with the second voltage.

6. The device as claimed in claim 3, further comprising:
   a seventh NMOS transistor coupled to the seventh PMOS transistor and including a control gate supplied with the second voltage, wherein the second voltage is smaller than a Vdsmax−a threshold voltage of at least one of the first, second, and seventh NMOS transistors, wherein the second voltage is larger than the power source line voltage−the Vdsmax+the threshold voltage of at least one of the first, second, and seventh NMOS transistors, and wherein the Vdsmax is a maximum voltage to prevent hot switching effect when turning on at least the one of the first and seventh NMOS transistors.

7. A device comprising:

a first power source line supplied with a first voltage potential;

a second power source line supplied with a second voltage potential lower than the first voltage potential;

a first circuit including:
  first and second transistors that are source-drain coupled in series between the first power source line and a first output node, each including a control gate coupled to a second output node, and
  third and fourth transistors that are source-drain coupled in series between the first power source line and the second output node, each including a control gate coupled to the first output node;

a second circuit including a fifth transistor coupled between the second power source line and the first output node and including a control gate coupled to the second output node;

a third circuit including a sixth transistor and a seventh transistor coupled in series between the first power source line and a node, each of the sixth transistor and the seventh transistor including a control gate supplied with a third voltage potential lower than the first voltage potential and higher than the second voltage potential, a connecting point of the sixth transistor and the seventh transistor being coupled to a connecting point of the first and second transistors, and a fourth circuit including an eighth transistor of a second conductivity type and a ninth transistor of a first conductivity type coupled in series between the first power source line and a second node, each of the eighth transistor and the ninth transistor including a control gate supplied with the third voltage potential, a connecting point of the eighth transistor and the ninth transistor being coupled to a connecting point of the third and fourth transistors, the first to fourth and seventh transistors being of the first conductivity type and the fifth and sixth transistors being of the second conductivity type different from the first conductivity type.

8. The device as claimed in claim 7, further comprising:

tenth to twelfth transistors of the second conductivity type each supplied with a control signal;

a thirteenth transistor of the second conductivity type coupled between the tenth transistor and the second output node;

a fourteenth transistor of the second conductivity type coupled between the eleventh transistor and the seventh transistor; and a fifteenth transistor of the second conductivity type coupled between the twelfth transistor and ninth transistor, gates of the thirteenth, fourteenth and fifteenth transistors being supplied with a fixed voltage potential.

9. The device as claimed in claim 8, further comprising:

a sixteenth transistor of the second conductivity type coupled between the first power source line and the connecting point of the sixth transistor and the seventh transistor; and a seventeenth transistor of the first conductivity type coupled between the seventh transistor and the fourteenth transistor, control gates of the sixteenth transistor and the seventeenth transistor being coupled to the second power source line.

10. A device comprising:

a command decoder configured to be responsive to a command to produce an enable signal;

a voltage generator configured to respond to a power supply voltage inputted from an outside to produce a first power source voltage higher than the power supply voltage, a second power source voltage lower than the first power source voltage, and a first control voltage lower than the first power source voltage and higher than the second power source voltage;

a voltage switch configured to receive the enable signal, the first and second power source voltages and the first control voltage and output one of the first and second power source voltages based on a state of the enable signal; and a decoding circuit configured to apply the one of the first and second power source voltages to one of signal lines corresponding to an information of an address signal, the voltage switch including:
  a selection circuit configured to output one of the first and second power source voltages based on the state of the enable signal, and
  a protection circuit comprising a first transistor to set a node of the selection circuit to a voltage potential within a predetermined range based on the first control voltage, wherein the selection circuit further includes:
  second and third transistors coupled in series between the first power source line and a first output node, each including a control gate coupled to a second output node;
  fourth and fifth transistors coupled in series between the first power source line and the second output node, each including a control gate coupled to the first output node; and
  a sixth transistor coupled between the second power source line and the first output node and including a control gate coupled to the second output node,
  wherein the selection circuit outputs one of the first and second power source voltages from the first output node.

11. The device as claimed in claim 10, the protection circuit further comprising:

a seventh transistor coupled to the first transistor and supplied with the second power source voltage.

12. The device as claimed in claim 10, the protection circuit further comprising:

a seventh transistor coupled in series to the first transistor supplied with the first control voltage, a connecting point of the first and seventh transistors being connected to a connecting point of the second and third transistors, the first transistor being of a first conductivity type and the seventh transistor being of a second conductivity type different from the first conductivity type.

13. The device as claimed in claim 12, the protection circuit further comprising:
an eighth transistor of the first conductivity type supplied with the first power source voltage and having a control gate supplied with the first control voltage; and
a ninth transistor of the second conductivity type coupled in series to the eight transistor and having a control gate supplied with the first control voltage, a connecting point of the eighth and ninth transistors being connected to a connecting point of the fourth and fifth transistors.

14. The device as claimed in claim 13,
wherein the protection circuit comprises a tenth transistor coupled in series to the third transistor and having a control gate supplied with a second control voltage different from the first control voltage, and
wherein the voltage switch comprises an eleventh transistor coupled in series to the tenth transistor and having a control gate supplied with the enable signal.

15. The device as claimed in claim 14, further comprising:
a twelfth transistor coupled in series between the third transistor and the tenth transistor and having a control gate supplied with a third control signal different from the first and second control signals; and
a thirteenth transistor coupled in parallel to the second transistor and having a control gate supplied with the third control signal.

16. A level shifter circuit comprising:
a first PMOS transistor directly connected between a high voltage supply and a first node and including a control gate directly connected to a first output node and a back gate directly connected to the high voltage supply;
a second PMOS transistor directly connected between the first node and a second output node and including a control gate directly connected to the first output node and a back gate directly connected to the first node;
a third PMOS transistor directly connected between the first node and a second node and including a control gate directly connected to a first voltage supply lower than the high voltage supply;
a first NMOS transistor connected between the second node and a ground supply and including a control gate supplied with a first input signal;
a fourth PMOS transistor directly connected between the high voltage supply and a third node and including a control gate directly connected to the second output node and a back gate directly connected to the high voltage supply;
a fifth PMOS transistor directly connected between the third node and the first output node and including a control gate directly connected to the second output node and a back gate directly connected to the third node;
a sixth PMOS transistor directly connected between the third node and a fourth node and including a control gate directly connected to the first voltage supply; and
a second NMOS transistor connected between the fourth node and the ground supply and including a control gate supplied with a second input signal.

17. The level shifter circuit as claimed in claim 16 further comprising an inverter having the second input signal as an input and the first input signal as an output.

18. The level shifter circuit as claimed in claim 16 further comprising:
a third NMOS transistor directly connected between the high voltage supply and the first node and including a control gate directly connected to the first voltage supply; and
a fourth NMOS transistor directly connected between the high voltage supply and the third node and including a control gate directly connected to the first voltage supply.

19. The level shifter circuit as claimed in claim 16 further comprising:
a third NMOS transistor connected between the third PMOS transistor and the first NMOS transistor and including a control gate directly connected to a second voltage supply lower than the high voltage supply; and
a fourth NMOS transistor connected between the sixth PMOS transistor and the second NMOS transistor and including a control gate directly connected to the second voltage supply.

20. The level shifter circuit as claimed in claim 19 wherein the first voltage supply and the second voltage supply are equal.

21. The level shifter circuit as claimed in claim 19 further comprising a seventh PMOS transistor connected between the third PMOS transistor and the third NMOS transistor and including a control gate directly connected to a third voltage supply lower than the high voltage supply.

22. The level shifter circuit as claimed in claim 16 further comprising a third NMOS transistor connected between the first output node and the ground supply and including a control gate supplied with the second input signal.

23. The level shifter circuit as claimed in claim 22 wherein the third NMOS transistor is a low voltage transistor.

24. The level shifter circuit as claimed in claim 22 further comprising a fourth NMOS transistor connected between the fifth PMOS transistor and the third NMOS transistor and including a control gate supplied with, a second voltage supply lower than the high voltage supply.

25. The level shifter circuit as claimed in claim 24 wherein the second voltage supply is Vdd.

* * * * *